(12) United States Patent
Pyon et al.

(10) Patent No.: US 11,990,251 B2
(45) Date of Patent: May 21, 2024

(54) METHODS FOR MANUFACTURING A SUPERCONDUCTOR

(71) Applicant: LUVATA WATERBURY, INC., Waterbury, CT (US)

(72) Inventors: Taeyoung Pyon, Waterbury, CT (US); Antti Kilpinen, Turku (FI)

(73) Assignee: LUVATA WATERBURY, INC., Waterbury, CT (US)

(*) Notice: Subject to any disclaimer, the term of this patent is extended or adjusted under 35 U.S.C. 154(b) by 0 days.

(21) Appl. No.: 18/183,913

(22) Filed: Mar. 14, 2023

(65) Prior Publication Data

US 2023/0215604 A1 Jul. 6, 2023

Related U.S. Application Data

(63) Continuation of application No. 16/652,055, filed as application No. PCT/US2019/017270 on Feb. 8, 2019, now Pat. No. 11,631,508.

(51) Int. Cl.
*H01B 12/10* (2006.01)
*H10N 60/01* (2023.01)

(52) U.S. Cl.
CPC ......... *H01B 12/10* (2013.01); *H10N 60/0128* (2023.02); *H10N 60/0184* (2023.02)

(58) Field of Classification Search
CPC .................. H10N 60/0184; H10N 60/0128
See application file for complete search history.

(56) References Cited

U.S. PATENT DOCUMENTS

2012/0035059 A1* 2/2012 Somerkoski ....... H10N 60/0184
420/580

* cited by examiner

*Primary Examiner* — Livius R. Cazan
(74) *Attorney, Agent, or Firm* — Hodgson Russ LLP (57) ABSTRACT

A method for manufacturing a superconductor is described. A metal assembly precursor can be formed within a hollow copper support element. Forming the metal assembly precursor within a hollow copper support element by positioning a plurality of conductor elements about a core including Sn to provide a first plurality of inner interstitial spaces between the plurality of conductor elements between the core and conductor elements and a second plurality of outer interstitial spaces between the hollow copper support element and the core, the plurality of conductor elements including unreacted Nb. The metal assembly precursor can be reduced via cold drawing to produce a reduced metal assembly. The reduced metal assembly can be reaction heat treated so that the unreacted Nb undergoes a phase transformation to a reacted superconductor.

11 Claims, 7 Drawing Sheets

| B (T) | RTR | RIT | TA |
|---|---|---|---|
| 11.0 | | | 2490 |
| 12.0 | 2280 | 2409 | 2020 |
| 13.0 | 1821 | 1948 | 1580 |
| 14.0 | 1418 | 1540 | 1220 |
| 15.0 | 1074 | 1192 | |
| 16.0 | 786 | 898 | |

METHODS FOR MANUFACTURING A SUPERCONDUCTOR

CROSS-REFERENCE TO RELATED APPLICATIONS

This application is a continuation of U.S. patent application Ser. No. 16/652,055, filed Mar. 29, 2020, which is a U.S. National Stage Entry of International Application No. PCT/US2019/017270, filed Feb. 8, 2019 that claims priority to U.S. Provisional Application No. 62/627,972, filed Feb. 8, 2019. The entire disclosures of the aforementioned applications are incorporated herein by reference.

FIELD OF THE DISCLOSURE

The disclosure generally relates to superconductors and the manufacture of superconductors.

BACKGROUND OF THE DISCLOSURE

Various structures and methods of preparing the superconductor precursor are known. When using a large number of filaments to fabricate a subelement unit, individual filament rod made from extrusion and subsequently drawn-down processes can be stacked into a new multi-filament billet, which, in turn is extruded and drawn down. One specific process is a rod-in-tube ("RIT") method. The RIT method includes fabricating subelements with an increased filament count and thinner copper hex tubing for the purposes of keeping the local area ratio ("LAR") small. A thick pure or alloyed niobium barrier is introduced to separate the filament bundle from the copper sheath. A Sn alloy core in the subelement rod is used to promote a ternary phase, such as $(NbTi)_3Sn$ or $(NbTa)_3Sn$. Another process is a "tubular" method where a subelement is made a copper sheathed tin source rod core, surrounded by a niobium or niobium-alloy tubing encased in a copper tube jacket. The cost associated with RIT method is significantly higher than even tubular method as it requires double extrusion (the first for mono filament rod and the second extrusion for subelement multi-filament billet) and subsequent multi-step drawing process. Another high cost component of the MT method is relatively large and thick niobium alloy barrier. The tubular method requires highly costly niobium alloy tubing which has extremely limited availability in alloying type, dimensions as well as manufacturing source. One of the major constraints of both RIT and tubular methods includes limited current carrying capacity due to the fact that the amount of reaction on niobium barrier must be controlled and suppressed to a certain level, so that the outer copper jacket is not contaminated.

Improved structures and methods of preparing a superconductor precursor is desired.

SUMMARY OF THE DISCLOSURE

The present disclosure describes structures and methods for manufacturing a superconductor. In one embodiment, a metal assembly precursor can be formed within a hollow copper support element. A method for manufacturing a superconductor is described. A metal assembly precursor can be formed within a hollow copper support element. Forming the metal assembly precursor within a hollow copper support element by positioning a plurality of conductor elements about a core including Sn to provide a first plurality of inner interstitial spaces between the plurality of conductor elements between the core and conductor elements and a second plurality of outer interstitial spaces between the hollow copper support element and the core, the plurality of conductor elements including unreacted Nb. The metal assembly precursor can be reduced via cold drawing to produce a reduced metal assembly. The reduced metal assembly can be reaction heat treated so that the unreacted Nb undergoes a phase transformation to a reacted superconductor. The metal assembly precursor can include a diffusion blocking layer between the plurality of conductor elements and the hollow copper support element.

The core can be solid and include one or more of the following: Sn, SnTi, SnCu, and $SnO_2$. In some embodiments, the metal assembly precursor can have a diameter that is equal to or greater than 30 mm. In other embodiments, metal assembly precursor can have a diameter that is equal to or greater than 50 mm. The reduced superconductor can have a diameter that is equal to or less than 5 mm.

According to some embodiments, inner interstitial elements can be positioned in one or more of the plurality of inner interstitial spaces. The inner interstitial elements can include at least one of the following: an oxidation additive and a pinning element. In one particular embodiment the inner interstitial elements include $SnO_2$ as the oxidation additive. In another embodiment, the inner interstitial elements include one or more of the following as the pinning element: Hf, Zr, and Ta.

The method can also include positioning outer interstitial elements in one or more of the plurality of outer interstitial spaces. The outer interstitial elements can including at least one of the following: a doping element, a conductor element, an oxidation additive, and an outer pinning element. In one particular example, the outer interstitial elements can include NbTi as the doping element. In another example, the outer interstitial elements can include pure Nb as the conductor element. In yet another example, the outer interstitial elements can include $SnO_2$ as the oxidation additive. The outer interstitial elements can include one or more of the following as the outer pinning element: Hf, Zr, or Ta.

In an embodiment, one or more of the following are cylindrical rods: the plurality of conductor elements, the inner interstitial elements, and the outer interstitial elements.

In some embodiments, each of the plurality of conductor elements are arranged to touch an adjacent conductor element of the plurality of conductor elements. The plurality of conductor elements being symmetrically disposed about a center of the core. Each of the inner interstitial elements can be spaced away from one another, such that each of the inner interstitial elements do not contact another of the inner interstitial elements. The interstitial elements can be symmetrically disposed about the center of the core.

A filament can be produced from the reduced superconductor. According to one embodiment, the filament can be stacked with additional filaments to produce a multifilament precursor, each additional filament produced from respective reduced superconductors. The multifilament precursor can be extruding into a multifilament superconductor. According to another embodiment, a monofilament superconductor can be produced from the reduced heat treated superconductor assembly.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Figure 1:
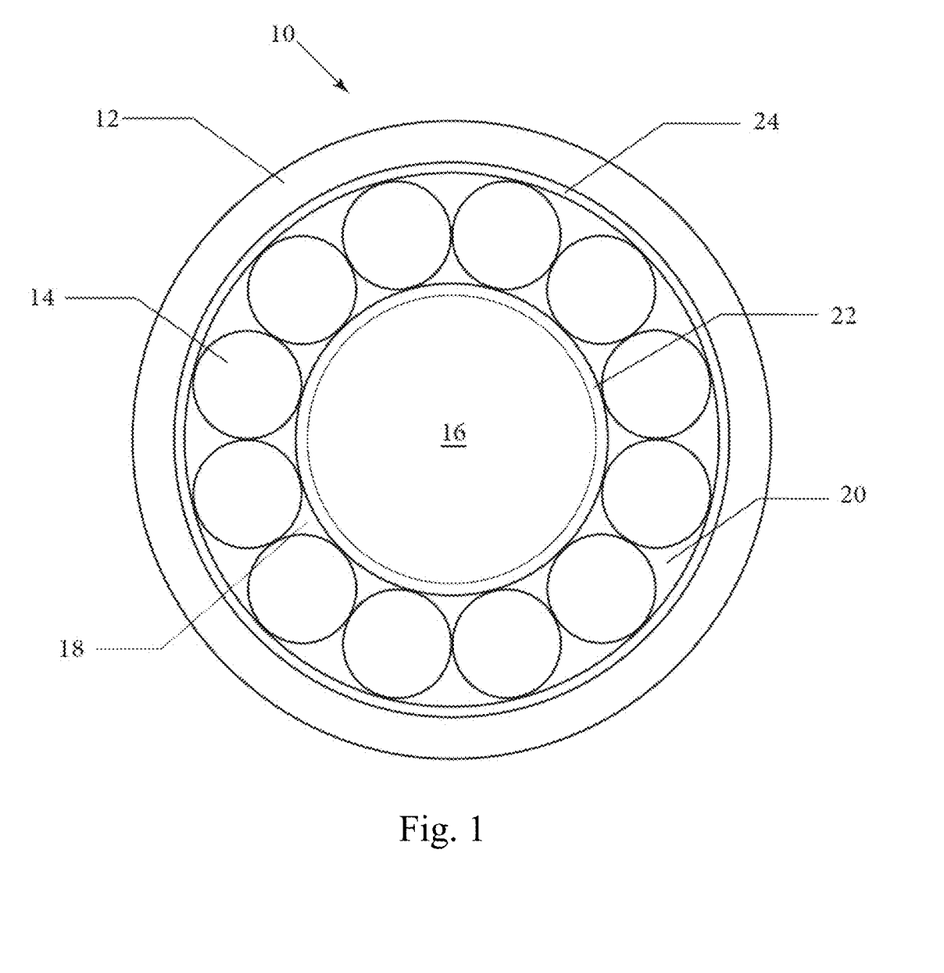
FIG. 1 is a schematic representation of a metal assembly precursor according to an embodiment of the present disclosure.

FIG. 1 is an example of a metal assembly precursor 10 that can be reduced and reacted into a superconductor. The metal assembly precursor 10 can be formed by positioning various precursor structures within an outer support element 12. According to one embodiment, the precursor structures can be interchangeable and unreacted, which allow for the metal assembly precursor 10 to be easily assembled and customized prior to being reduced and ultimately reacted and into a desired, finished superconductor.

The support element 12 can be adapted to hold the metal assembly precursor 10 together. The support element 12 can comprise a hollow cylinder, wherein conductor elements are arranged inside the cylinder, together with an Sn-source (e.g. at a center of the precursor 10). In this example, the surrounding support element 12 can be made of a pure Cu or a Cu-alloy, because it is advantageous that the finished superconductor (e.g. a filament of a monofilament or multifilament superconductor) can be embedded in copper for both electrical and mechanical stability. The support element 12 can be made of the same material as any precursor structures (e.g. a conductor element casing).

According to one embodiment, the precursor structures can include a plurality of conductor elements 14 about a core 16. The conductor elements 14 can be arranged between the core 16 and support element 12 to provide a first plurality of inner interstitial spaces 18 located between the plurality of conductor elements 14 and the core 16. The conductor elements 14 may also be arranged between the core 16 and support element 12 to provide a second plurality of outer interstitial spaces 20 between the conductor elements 14 and the support element 12.

The plurality of conductor elements 14 can comprise a conductor core containing a superconductor base material (e.g. unreacted), which can serve as a superconductor filament in a finished, reacted superconductor. In this example the conductor elements 14 may comprise pure Nb, or an Nb alloy such as NbTa (e.g. Nb8 wt % Ta alloy), NbTi, NbHf and NbZr (e.g. a Nb-1 Zr alloy). The conductor core can comprise pure Nb, apart from impurities, since pure Nb is ductile and easily to be formed into thin filaments. According to certain embodiments, each conductor element 14 may further comprise a casing arranged, for example immediately, about the core. For example, the conductor elements 14 can have a thin Cu or Cu alloy casing (not shown), which can serve as a channel for Sn diffusion. A thin copper encasement can improve uniformity of Sn diffusion during reaction heat treatment. The thickness of the copper encasement can be defined by the local area ratio (e.g. area ratio of Cu to conductor element in the interfilamentary region). In one embodiment, the local area ratio ("LAR") can be in the range of 0.04 to 0.09. In one particular embodiment, the LAR can be in the range of 0.04-0.06.

The core 16 can be an Sn source for providing Sn to the conductor elements 14.

The core 16 can be a solid, cylindrical rod of pure or alloyed Sn. For example, the core 16 can include one or more of the following: pure Sn, SnTi, SnCu, and $SnO_2$. The core 16 can be powder or solid. The core 16 may have an outer layer 22, which can include a Cu sheath and/or NbTi foil wrap, to improve structural characteristics, diffusion of material, and can also serve to hold a powder core 16 in position. The core 16 can be adapted to have a size and content of diffusion material (e.g. Sn), so that after diffusion that occurs during reaction, finished superconductor filaments (e.g. the conductor elements 14) can be doped. In one example the superconductor filaments can be constituted of $Nb_3Sn$ doped with Ti and/or Ta.

In an embodiment, the metal assembly precursor 10 can further include a diffusion blocking layer 24 arranged between the support element 12 and conductor elements 14. The diffusion blocking layer 24 may be needed to prevent Sn from contaminating outer Cu jacket. The diffusion blocking layer 24 can be, for example, made of a layer of pure or alloyed Nb or Ta located between the row of conductor element and the outer Cu jacket (e.g. one or more of the following Ta, TaNb, and Nb). It can be desired to hinder diffusion of Sn during the reaction heat treatment, since the Sn may otherwise diffuse into the outer Cu jacket, resulting in contamination of the outer Cu jacket, which would lead to high resistivity. The diffusion-blocking layer 24 can be adapted to block diffusion at temperatures up to a desired diffusion temperature. In one particular example, the diffusion-blocking layer 24 can be Ta40Nb.

Figure 2:
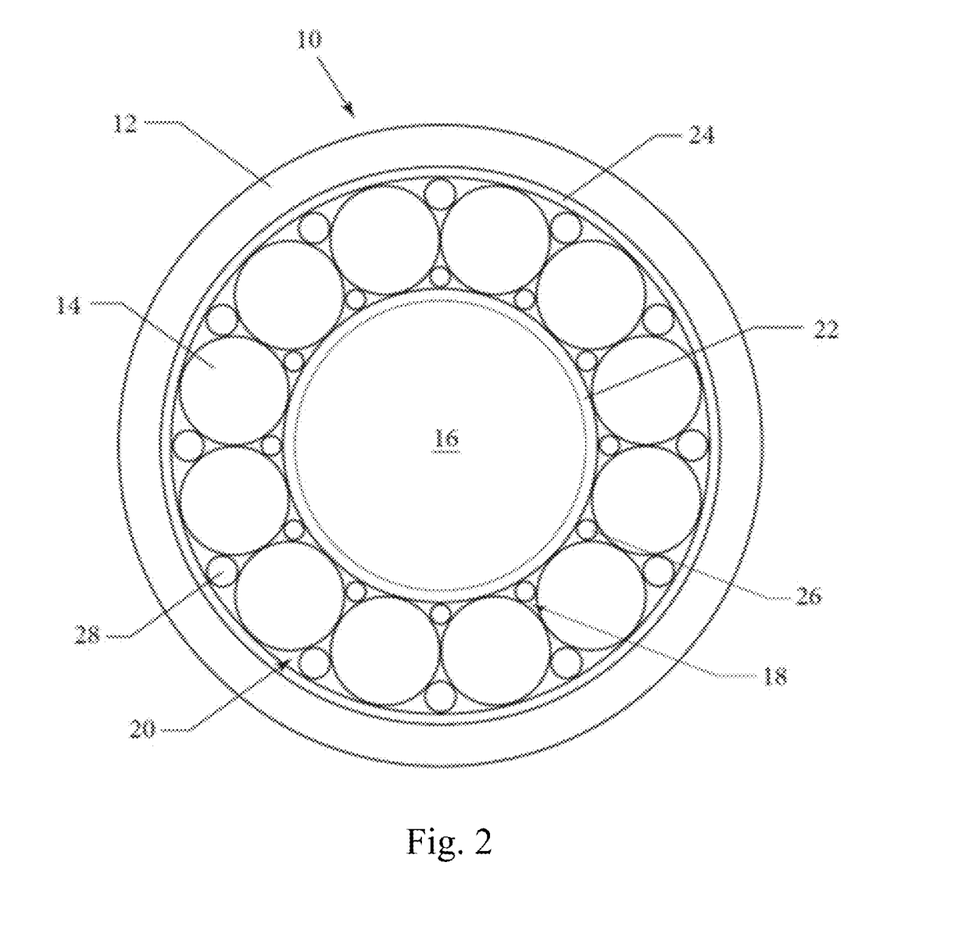
FIG. 2 is a schematic representation of a metal assembly precursor according to another embodiment of the present disclosure.

FIG. 2 depicts another embodiment of a superconductor precursor 10 according to the present disclosure, showing that inner interstitial elements 26 can be positioned in one or more of the inner interstitial spaces 18 and/or that outer interstitial elements 28 can be positioned in one or more of the plurality of outer interstitial spaces 20.

The precursor 10 can include an Sn or Sn alloy core 16 surrounded by an outer layer 22. The outer layer 22 may be a Cu sheath and/or NbTi foil wrap. A plurality of conductor elements 14 can surround the core 16. The plurality of conductor elements 14 may be arranged edge to edge such that each of the plurality of conductor elements is in contact with an adjacent conductor element 14, thereby forming a row. The conductor elements 14 may also be symmetrically disposed about the center of the core 16.

The inner interstitial elements 26 can be placed in the inner interstitial spaces 18 between the core 16 and conductor elements 14. The inner interstitial elements 26 may be spaced away from one another, such that each inner interstitial element 26 does not come into contact with another inner interstitial element 26. The inner interstitial elements 26 can be arranged symmetrically about the center of the core 16. The inner interstitial spaces 18 between the conductor elements 14 and the core 16 may provide a location for additional element(s) to improve superconducting properties. For example, "impurities" can be added as inner interstitial elements 26 to promote an internal oxidation, and thereby serve as forming a flux pinning center in the system and/or refine microstructure. An example of an oxidation additive is $SnO_2$. Pinning elements used as inner interstitial elements 26 can include one or more of the following: Hf, Zr, and Ta. Alternatively, or in addition to "impurities," the inner interstitial elements 26 can include a plurality of smaller size conductor elements (e.g. provided between the conductor elements 14 and an enveloping Cu sheath and/or NbTi foil wrap). Thus, the inner interstitial elements can include at least one or more of the following: an oxidation additive, a pinning element, and a conductor.

Outer interstitial elements 28 can be positioned in one or more of the plurality of outer interstitial spaces 20. The outer interstitial elements 28 can include one or more of the following: a doping element, a conductor element, an oxidation additive, and an outer pinning element. In one example, the outer interstitial elements 28 are additional conductor elements that can be included in the precursor 10 between the outermost copper tube 12 and the plurality of conductor elements 14. The additional conductor elements can be made of a same conductor material as the conductor elements 14, but have a smaller cross-section than the conductor elements 14. The additional conductor elements can increase the overall volume of conductor elements, thereby increase the current carrying capacity of the finished superconductor. Moreover, the additional conductor elements can provide a more uniform interface between a pure or alloyed Nb or Ta diffusion barrier 24 and the row of conductor elements 14.

According to another embodiment, the outer interstitial elements 28 can be doping elements providing a doping source for doping the conductor elements 14. In one particular example, there can be at least as many outer interstitial elements 28 (e.g. doping elements) as the number of conductor elements. For example, at least one doping element can be positioned adjacent to each conductor element 14. After a diffusion heat treatment, the doping substance contained in the doping elements can therefore be more homogeneously spread out throughout the superconductor, which can improve the quality of the superconductor.

The doping substance, for example the doping core, may be an NbTi alloy for doping the conductor element with Ti. This alloy is ductile and can easily be formed into the desired shape of the doping element. The number and size of the doping elements is chosen so that the finished superconductor filaments contain between 0.2-3% by weight Ti, preferably between 0.5-1.5% by weight Ti.

The inner interstitial elements 26 and/or outer interstitial elements 28 can be arranged adjacent (e.g. not in contact with), or in contact with, the conductor elements 14. For instance, inner interstitial elements 26 and/or an outer interstitial elements 28 next to a conductor element 14 can be at least as close to the conductor element 14 as the closest other conductor element 14. This can have certain advantages during reaction heat treatment, including when the outer interstitial elements 28 including doping elements, the diffusion distance for the doping substance can be short. Similar advantages can be found when the inner interstitial elements 26 and/or outer interstitial elements 28 are one or more of the following: oxidation additive, a pinning element, and a conductor. The conductor elements 14 and inner interstitial elements 26 and/or outer interstitial elements 28, however, can constitute separate elements until diffusion occurs via reaction heat treatment.

Since the size of the inner interstitial elements 26 and/or outer interstitial elements 28 can be much smaller (e.g. by area of cross-section) than the size of the conductor elements 14, the inner interstitial elements 26 and/or outer interstitial elements 28 can be arranged in the unfilled spaces formed between the conductor elements. Only one layer of conductor elements 14 is shown in the figures for the sake of simplicity, but in practice any number of concentric layers of conductor elements may be used. It is also contemplated that multiple interstitial elements can be positioned in each inner interstitial space 18 and/or each outer interstitial space 20. In some embodiments the inner interstitial elements 26 are smaller (e.g. by area of cross-section) than the outer interstitial elements 28. However, the interstitial elements 26 can alternatively be the same size, or larger (e.g. by area of cross-section) than the outer interstitial elements 28 depending on, for example, the desired application.

According to embodiments of the present disclosure, the metal assembly precursor 10 can be formed by positioning various solid precursor structures within an outer support element 12. The precursor structures (e.g. conductor elements 14, core 16, inner interstitial elements 26, and/or outer interstitial elements 28) can have elongated shapes, so that their lengths are longer than their widths and heights. Although the precursor structures are depicted as cylindrical rods shaped with a circular cross section, other shapes (e.g. polygonal, irregular, asymmetrical, etc.) are also within the scope of the present disclosure. For example, other shapes of conductor and doping elements may be used such as hexagonal or trapezoidal shapes to increase the fill factor of the assembly. The precursor structures can have a uniform cross-section for their entire lengths. For at least a majority of the precursor structures, the cross-sectional area of each interstitial element (e.g. outer or inner) can be smaller than one fifth of the cross-sectional area of each conductor element.

Figure 3:
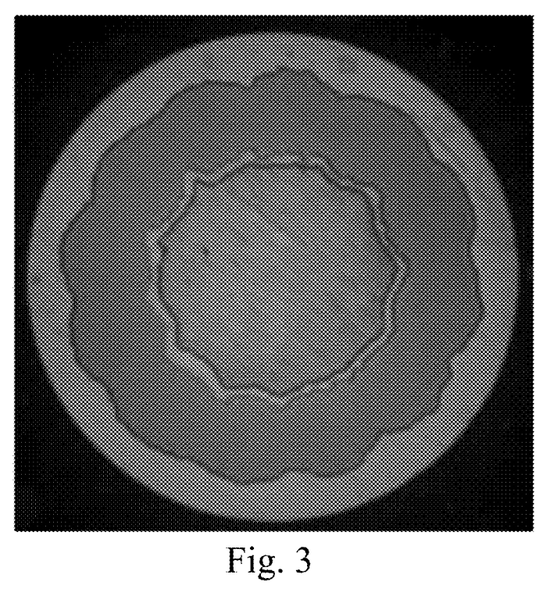
FIG. 3 is a photograph of a metal assembly.
Figure 4:
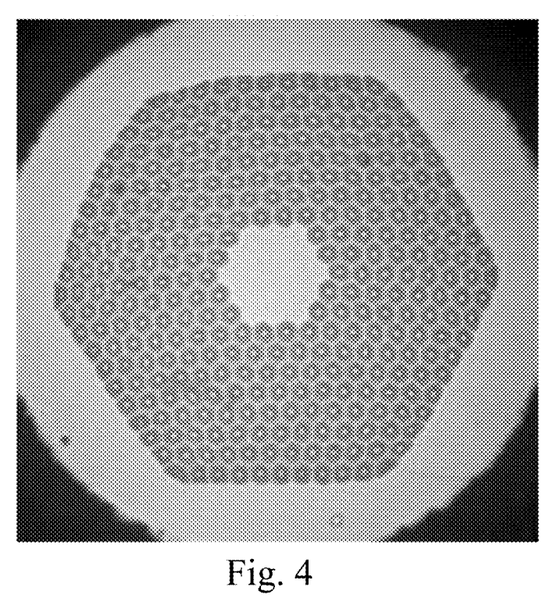
FIG. 4 is a photograph of a plurality of metal assemblies stacked in a wire.

Each metal assembly can begin from a 30-100 mm diameter (or 50-100 mm diameter), and reduced in diameter via cold drawing. FIG. 3 is a photograph of a metal assembly after cold drawing to a 1.2 mm diameter. FIG. 4 is a photograph of a plurality of metal assemblies stacked in a wire, and cold drawn to a 1.25 mm diameter. Unlike conventional methods (e.g. RIT method) to fabricate an equivalent wire unit, the RTR method offers simpler steps with versatile and flexible design options. For example, as compared to the RIT method, the RTR method does not require initial compaction or extrusion in order to create a sub-element. Whereas prior art methods do not allow for an Sn source to be introduced before hot extrusion process, due to low melting point of Sn, the RTR method allows an Sn source to be included in the initial assembly stage. In testing, the metal assembly has exhibited excellent processability. In particular, wire breakage was not experienced during drawing processes that can occur after/during the initial heat treatment.

Figure 5:
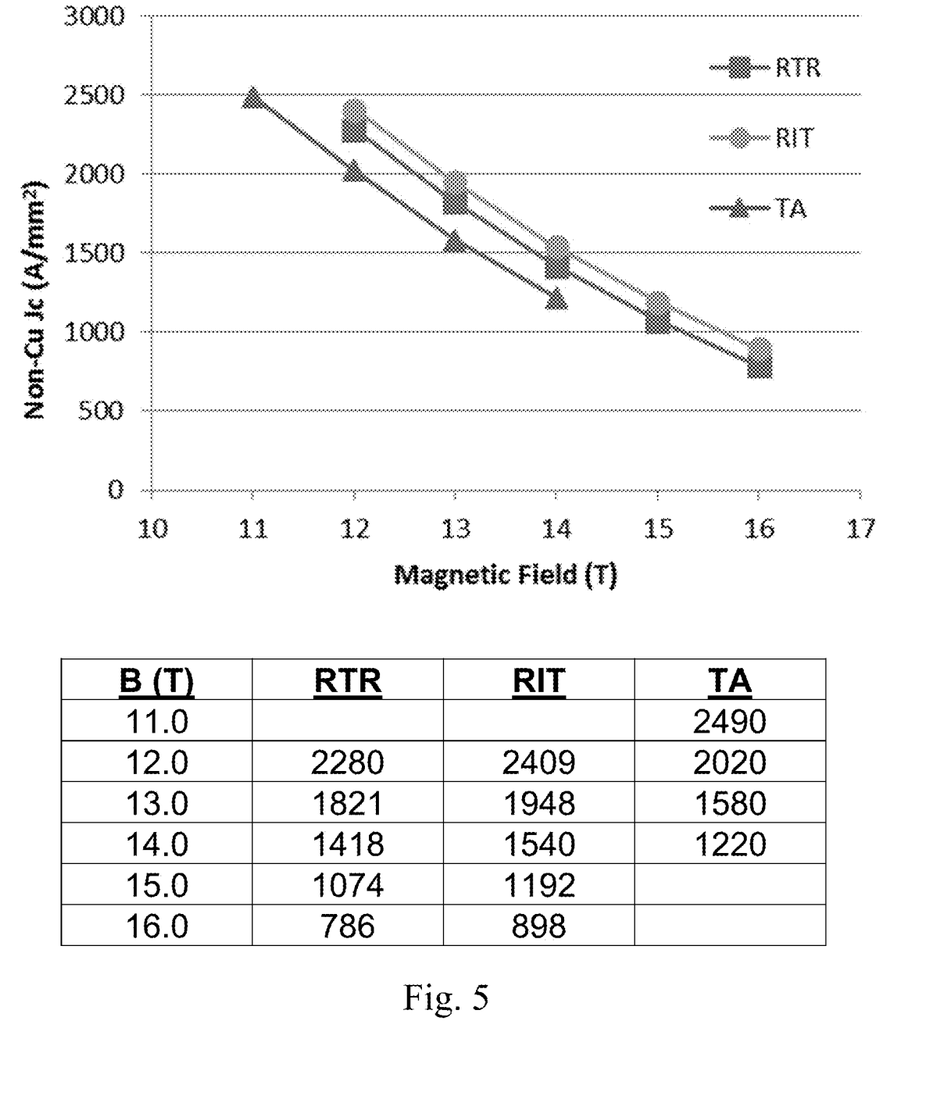
FIG. 5 is a graph and table comparing the performance of finished superconductors.

FIG. 5 is a graph and table comparing the performance of a finished superconductor made from the metal assembly precursor illustrated in FIG. 1 (i.e. a rod-to-ring metal assembly or "RTR") to two reference superconductors made from prior art metal assemblies. Specifically, the prior art metal assemblies include the rod-in-tube ("RIT") and tubular ("TA") metal assembly precursors described in the background section of the present disclosure. A superconductor formed from the metal assembly precursor illustrated in FIG. 2 can lead to further performance improvements as compared to the metal assembly precursor illustrated in FIG. 1 (e.g. by taking advantage of the interstitial spaces).

Figure 6:
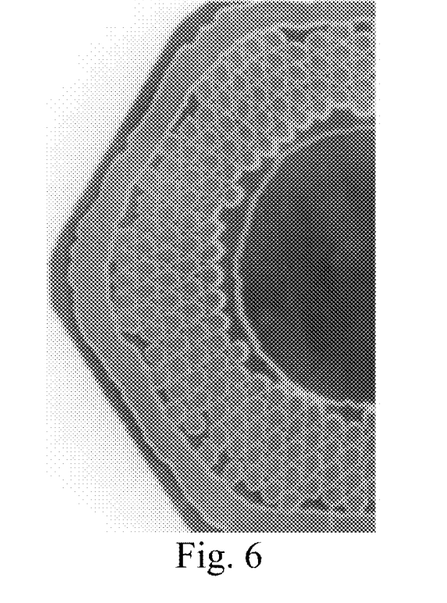
FIG. 6 is a photograph of an RIT metal assembly.
Figure 7:
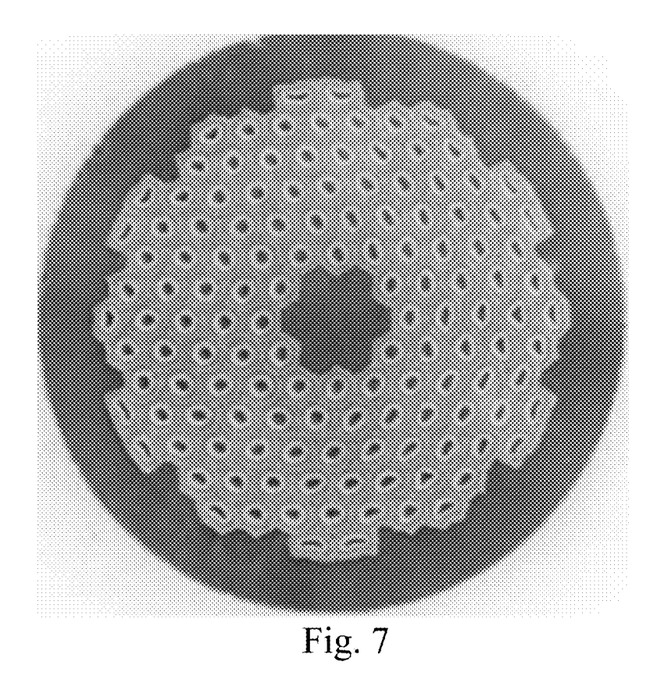
FIG. 7 is a photograph of a stacked wire made from a plurality of RIT metal assemblies.
Figure 8:
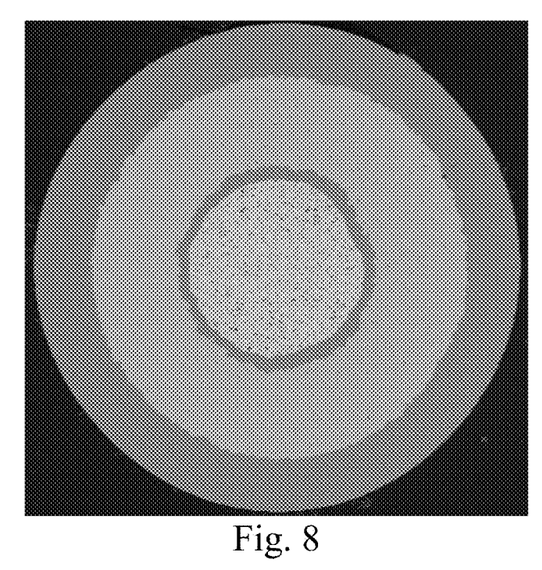
FIG. 8 depicts a tubular metal assembly.
Figure 9:
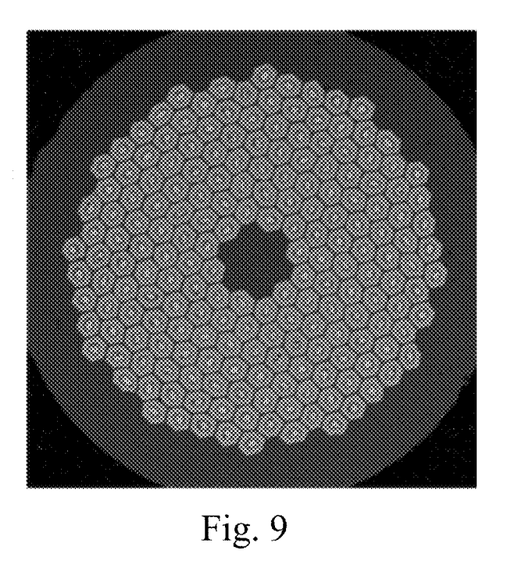
FIG. 9 depicts a stacked wire made from a plurality of tubular metal assemblies.

FIG. 6 depicts an RIT metal assembly and FIG. 7 depicts stacked wire made from a plurality of RIT metal assemblies. FIG. 8 depicts a TA metal assembly and FIG. 9 depicts a stacked wire made from a plurality of TA metal assemblies.

As can be seen, the RTR assembly has a non-copper critical current density that performs nearly as well as the RIT method. Moreover, the RTR assembly performed significantly better than the superconductor made with a TA metal assembly. However, the RTR assembly can be made at a substantially lower cost than the RIT method, and also be producible in much longer length. This method is highly cost effective as it does not require making a relatively large size sub-element unit that need to be extruded with higher reduction in cross section area.

Figure 10:
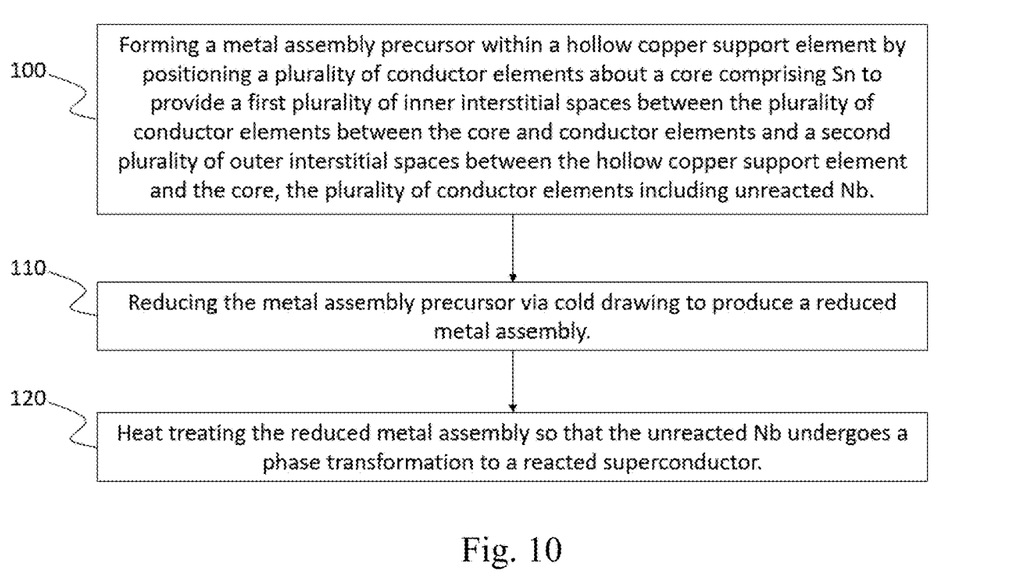
FIG. 10 is a flowchart of a method for manufacturing according to an embodiment of the present disclosure.

FIG. 10 depicts a method for manufacturing a superconductor according to the present disclosure. In Step 100, a metal assembly precursor can be formed within a hollow copper support element by positioning a plurality of conductor elements about a core comprising Sn to provide a first plurality of inner interstitial spaces between the plurality of conductor elements between the core and conductor elements and a second plurality of outer interstitial spaces between the hollow copper support element and the core, the plurality of conductor elements including unreacted Nb or Nb alloy. In Step 110, the metal assembly precursor can be reduced via cold drawing to produce a reduced metal assembly. In Step 120, the reduced metal assembly is heat treated so that the unreacted Nb or Nb alloy undergoes a phase transformation to a reacted superconductor.

Examples

In a first example, the metal assembly precursor 10 includes a Cu outer support element 12, pure Nb conductor elements 14, an Sn core 16, an NbTi foil outer layer 22, a Ta diffusion-blocking layer 24, NbTi inner interstitial elements 26, and pure Nb outer interstitial elements 28. This arrangement can produce an $(NbTi)_3Sn$ ternary phase superconductor (e.g. after heat treatment and reduction) having an SnCu core, improved filament fraction (e.g. at both interstitial locations), and a Ta barrier. Out of the following examples, this arrangement can be the least costly and allow for the excellent drawability. However, the Jc performance of this design may be lower than the following examples provided herein.

In a second example, the metal assembly precursor 10 includes a Cu outer support element 12, Nb1Zr conductor elements 14, an SnTi core 16, Cu outer layer 22, a Ta40Nb diffusion-blocking layer 24, $SnO_2$ inner interstitial elements 26, and pure Nb outer interstitial elements 28. This arrangement can produce an $(NbTi)_3Sn$ ternary phase superconductor (e.g. after heat treatment and reduction) having an SnTi core, artificial pinning centers (e.g. via internal oxidation by $SnO_2$ and Nb1Zr), and a Ta40Nb barrier. Compared to the first example, this arrangement can provide improved Jc by grain refinement and artificial pinning centers, but comes at a higher manufacturing cost and less processibility.

In a third example, the metal assembly precursor 10 includes a Cu outer support element 12, Nb8 wt % Ta conductor elements 14, an $Sn/SnO_2$ core 16, Cu outer layer 22, a Ta40Nb diffusion-blocking layer 24, Nb1Zr inner interstitial elements 26, and Nb1Zr outer interstitial elements 28. This arrangement can produce an $(NbTa)_3Sn$ ternary phase superconductor (e.g. after heat treatment and reduction) having an $Sn/SnO_2$ core, artificial pinning centers (e.g. via internal oxidation by $SnO_2$ and Nb1Zr), and a Ta40Nb barrier. Compared to the first and second examples, this arrangement provides the highest Jc, but comes at the highest manufacturing cost and least processability due to $Sn/SnO_2$ powders.

Although the present disclosure has been described with respect to one or more particular embodiments, it will be understood that other embodiments of the present disclosure may be made without departing from the spirit and scope of the present disclosure.

What is claimed is:

1. A method for manufacturing a superconductor, comprising:
   forming a metal assembly precursor within a hollow copper support element by positioning a plurality of conductor elements about a core including Sn to provide a first plurality of inner interstitial spaces between the plurality of conductor elements between the core and conductor elements and a second plurality of outer interstitial spaces between the hollow copper support element and the core, the plurality of conductor elements including unreacted Nb;
   positioning inner interstitial elements in one or more of the plurality of inner interstitial spaces, the inner interstitial elements including $SnO_2$ rods configured to serve as an oxidation additive;
   reducing the metal assembly precursor via cold drawing to produce a reduced metal assembly;
   reaction heat treating the reduced metal assembly so that the unreacted Nb undergoes a phase transformation to a reacted superconductor;
   stacking the reduced metal assembly with additional reduced metal assemblies to produce a multifilament precursor; and
   wherein the metal assembly precursor includes a diffusion blocking layer between the plurality of conductor elements and the hollow copper support element;
   wherein reaction heat treating the reduced metal assembly includes reaction heat treating the multifilament precursor such that the reacted superconductor is a multifilament superconductor.

2. The method of claim 1, wherein the inner interstitial elements further include a pinning element that comprises one or more of the following: Hf, Zr, and Ta.

3. The method of claim 1, further comprising positioning outer interstitial elements in one or more of the plurality of outer interstitial spaces, the outer interstitial elements including at least one of the following: a doping element, a conductor element, an oxidation additive, and an outer pinning element.

4. The method of claim 3, wherein the outer interstitial elements include $SnO_2$ as the oxidation additive.

5. The method of claim 3, wherein the outer interstitial elements include one or more of the following as the outer pinning element: Hf, Zr, or Ta.

6. The method of claim 3, wherein one or more of the following are cylindrical rods: the plurality of conductor elements and the outer interstitial elements.

7. The method of claim 1, wherein the core is solid and comprises one or more of the following: Sn, SnTi, SnCu, and $SnO_2$.

8. The method of claim 1, wherein the $SnO_2$ rods are cylindrical.

9. The method of claim 1, wherein the metal assembly precursor has a diameter that is equal to or greater than 30 mm.

10. The method of claim 1, wherein the reduced superconductor has a diameter that is equal to or less than 5 mm.

11. The method of claim 1, wherein each of the plurality of conductor elements are arranged to touch an adjacent conductor element of the plurality of conductor elements, the plurality of conductor elements being symmetrically disposed about a center of the core;
  wherein each of the inner interstitial elements are spaced away from one another, such that each of the inner interstitial elements do not contact another of the inner interstitial elements, the interstitial elements being symmetrically disposed about the center of the core.

* * * * *

UNITED STATES PATENT AND TRADEMARK OFFICE
CERTIFICATE OF CORRECTION

PATENT NO. : 11,990,251 B2
APPLICATION NO. : 18/183913
DATED : May 21, 2024
INVENTOR(S) : Taeyoung Pyon and Antti Kilpinen It is certified that error appears in the above-identified patent and that said Letters Patent is hereby corrected as shown below:

On the Title Page

Items (63/60) "Related U.S. Application Data" should read:
--(63) Continuation of application No. 16/652,055, filed as application No. PCT/US2019/017270 on Feb. 8, 2019, now Pat. No. 11,631,508.
(60) Provisional application No. 62/627,972, filed on Feb. 8, 2018.--

Signed and Sealed this
Third Day of September, 2024

Katherine Kelly Vidal
*Director of the United States Patent and Trademark Office*